(12) United States Patent  (10) Patent No.: US 6,608,329 B1
Chen  (45) Date of Patent: Aug. 19, 2003

(54) PURPLISH PINK LIGHT EMITTING DIODE

(75) Inventor: Hsing Chen, Ju-Bei (TW)

(73) Assignee: Solidlite Corporation, Shin Chu (TW)

( * ) Notice: Subject to any disclaimer, the term of this patent is extended or adjusted under 35 U.S.C. 154(b) by 0 days.

(21) Appl. No.: 10/226,969

(22) Filed: Aug. 22, 2002

(30) Foreign Application Priority Data

Mar. 28, 2002 (TW) ..................................... 91204061 U

(51) Int. Cl.[7] .......................... H01L 27/15; H01L 33/00
(52) U.S. Cl. .............................. 257/79; 257/98; 257/81
(58) Field of Search ........................... 257/79, 98, 301, 257/81–85, 88, 99, 103, 100, 89; 313/503, 504, 512, 498

(56) References Cited

U.S. PATENT DOCUMENTS

| | | | | |
|---|---|---|---|---|
| 5,952,681 A | * | 9/1999 | Chen | 257/89 |
| 5,962,971 A | * | 10/1999 | Chen | 313/512 |
| 5,998,925 A | * | 12/1999 | Shimzu et al. | 313/503 |
| 6,066,861 A | * | 5/2000 | Hohn et al. | 257/99 |
| 6,084,250 A | * | 7/2000 | Justel et al. | 257/89 |

OTHER PUBLICATIONS

Craford, M George, LEDs Challenge the Incandescents, IEEE 1992, pp. 24–29.*

* cited by examiner

*Primary Examiner*—Wael Fahmy
*Assistant Examiner*—(Vikki) Hoa B. Trinh
(74) *Attorney, Agent, or Firm*—Pro-Techtor International Services

(57) ABSTRACT

The present invention of a purplish pink light emitting diode irradiates a purple light with a wavelength ranging from 405 to 430 nm of a LED chip of a light emitting diode onto a red fluorescent powder coated on the surface thereon such that the purple light excites the fluorescent powder to produce a red light with a wavelength about 650 nm. The mixture of the excited red light and the original purple light from the purple light emitting diode produces a purplish pink or pinkish red light emitting diode in a new color tone with extensive application. To use the neoteric and unique color (similar to the color of a Hello Kitty) as a backlight or for displaying or illumination on electronic merchandises, such as mobile phones, attracts the consumers of the young generation.

4 Claims, 3 Drawing Sheets

PURPLISH PINK LIGHT EMITTING DIODE

BACKGROUND OF THE INVENTION

Description of the Prior Art

To compare with a regular illuminating light, the light emitting diode has the advantages of being electricity-saving, recyclable and having longer lifetime. With the enhanced brightness and reduced cost, to illuminate by a semiconductor is achievable in the future.

At the present time, the colors of the light emitting diode within the scope of the visible light include red, orange, orangish red, yellow, yellowish green, green, blue and purple. The lack of other optional mixed colors makes the development of light emitting diodes with different wavelengths become one of the focused researches. The traditional method of manufacturing light sources of mixed colors requires light emitting LED chip of more than two colors to be sealed together. The involved die-attachment and bonding procedures during the sealing are quite complicated. Furthermore, since the materials of the light emitting LED chip of two different colors are different, the required driving electric pressures vary as well. Therefore, one of the shortcomings thereof is that it is necessary to add different driving electric currents to adjust the brightness and colors.

A new technique using one light emitting diode to produce multiple colors mainly coats a layer of fluorescent powder on the surface of a LED chip such that the light emitted by the light emitting LED chip excites the layer of fluorescent powder thereby producing another kind of color light and further produces new colors of more wavelengths with the color light from the original light emitting LED chip. For example, the patent of a white light emitting diode (U.S. Pat. No. 5,998,925) of Nichia corporation adds the yellow (YAG) fluorescent powder to a blue light emitting diode with a wavelength about 460 nm and uses the blue light to excite the yellow (YAG) fluorescent powder to emit a yellow light with a longer wavelength about 560 nm. As indicated in FIGS. 2 and 3, the peak of the excitation spectrum or the absorption spectrum is at 460 nm approximately. The blue light of this wavelength is able to excite the yellow light with a spectrum about 560 nm from the YAG fluorescent powder. Therefore, a white light emitting diode is generated through the complementary principle of the yellow and the blue colors.

The inventor of the present invention has been granted with many LED related patents in the past years. More especially, the inventor pioneered in utilizing the ultraviolet light to excite the fluorescent powder to produce a white light or various color lights with three wavelengths, for example, U.S. Pat. No. 5,952,681 and U.S. Pat. No. 5,962,971 and the other patents in the process of application.

SUMMARY OF THE INVENTION

The present invention of a purplish pink light emitting diode utilizes the abovementioned principle to make a light emitting LED chip excite a fluorescent powder with the difference of using a red fluorescent powder. The excitation spectrums (the absorption spectrum) indicated in FIGS. 4 and 5 show that the components of the red fluorescent powder (1) are $6MgO \cdot As_2O_5$: Mn in FIG. 4 and the components of the red fluorescent powder (2) are $3.5MgO \cdot 0.5MgF_2 \cdot GeO_2$: Mn. The fluorescent powder used in the present invention is an inorganic oxide with an excitation peak at about 420 nm. The purple light emitting diode with a wavelength ranging from 405 to 430 nm irradiates on the fluorescent powder and the purple light excites the red fluorescent powder to produce a red light with a wavelength of 650 nm and the red light further mixes with the purple light generated from the original light emitting LED chip to produce a purplish pink or pinkish red light emitting diode.

To enable a further understanding of the manufacturing method and contents of the purplish pink light emitting diode of the present invention, the brief description of the drawings below is followed by the detailed description of the preferred embodiment.

DETAILED DESCRIPTION OF THE PREFERRED EMBODIMENTS

Figure 1:
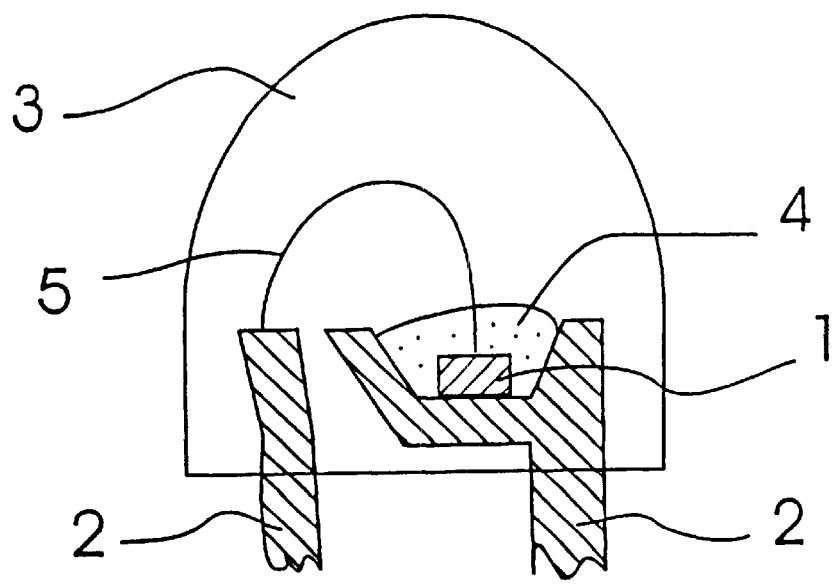
FIG. 1 is a structural drawing of a lamp light emitting diode coated with a layer of fluorescent powder.
Figure 2:
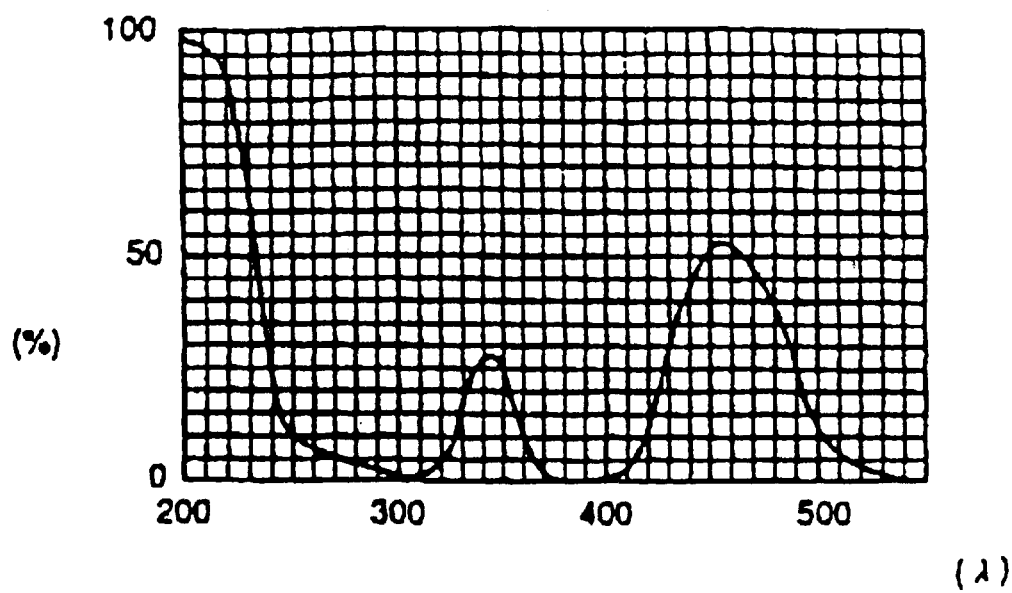
FIG. 2 is an excitation spectrum of the yellow (YAG) fluorescent powder of the Nichia corporation.
Figure 3:
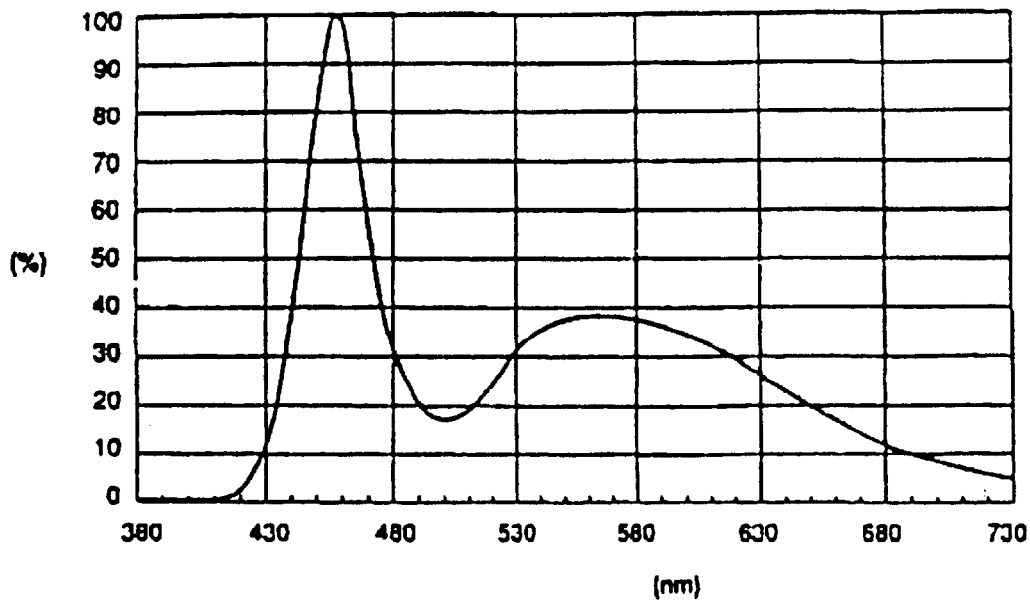
FIG. 3 is an emission spectrum of the yellow light of the fluorescent powder of the Nichia corporation.
Figure 4:
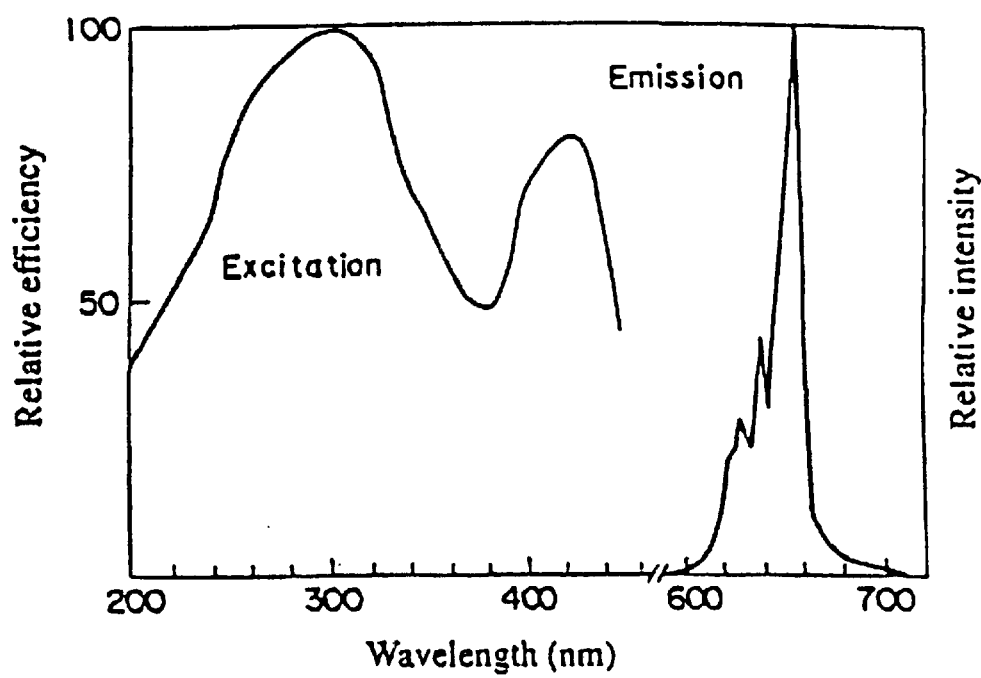
FIG. 4 is an excitation spectrum of the red fluorescent powder (1) and a red color light emission spectrum of the present invention of a purplish pink light emitting diode.
Figure 5:
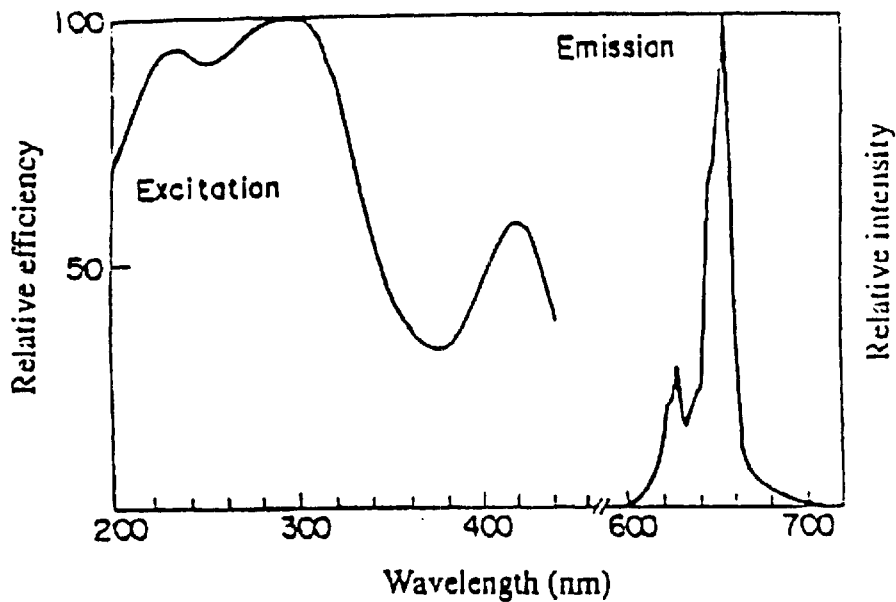
FIG. 5 is an excitation spectrum of the red fluorescent powder (2) and a red color light emission spectrum of the present invention of a purplish pink light emitting diode.
Figure 6:
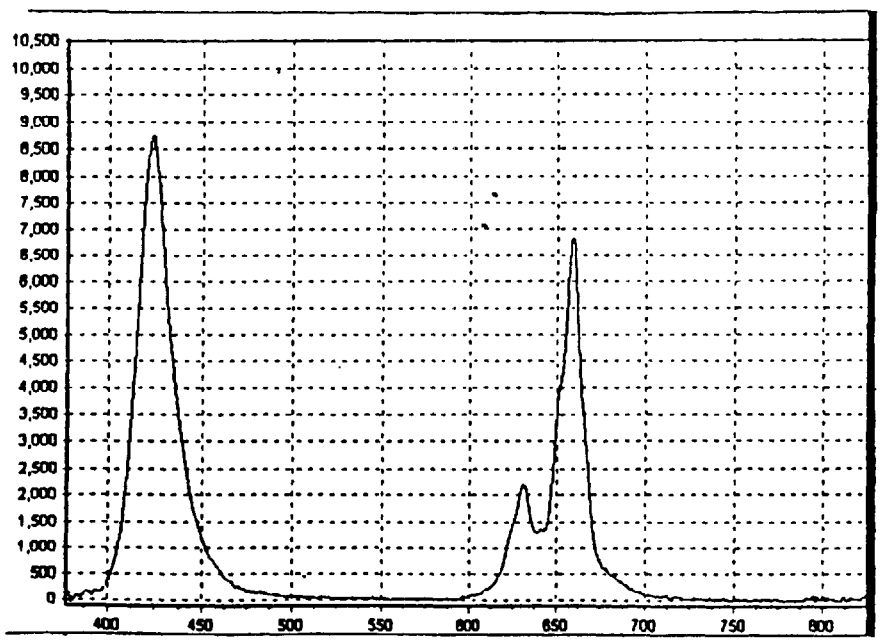
FIG. 6 is an emission spectrum of the purple and red lights of the present invention of a purplish pink light emitting diode.

A LED chip (1) of a purple light emitting diode with a wavelength ranging from 405 to 430 nm is selected to be placed on a leader frame (2); a proper amount of fluorescent powder with components of $6(MgO) \cdot As_2O_5$: Mn or $3.5(MgO) \cdot 0.5(MgF_2) \cdot GeO_2$: Mn and a transparent gel (3) are mixed into a fluorescent gel (4). Through the touching method, the fluorescent gel (4) is directly, or indirectly coated on the LED chip (1) of the purple light emitting diode. Then it is sealed into a lamp type or a surface mount type. Under the excitation of the purple light, the red fluorescent powder produces a red light with a wavelength about 650 nm, as indicated in FIGS. 4 or 5; the excited red light mixes with the purple light from the LED chip (1) of the purple light emitting diode to produces a purplish pink or pinkish red light emitting diode FIG. 6 is an emission spectrum of a purplish pink light emitting diode and clearly shows that the peak of the purple light is approximately at 405 nm and the peak of the red light generated from the red fluorescent powder excited by the purple light is approximately at 650 to 660 nm. The amount of fluorescent powder added during the manufacturing procedure controls the color to be more purplish or more reddish.

The most available method of using a light emitting LED chip to excite the fluorescent powder is the one adopted by the Nichia corporation. It utilizes a blue light emitting diode to excite a yellow (YAG) fluorescent powder thereby producing a white light with two wavelengths or utilizes an ultraviolet light emitting diode to excite a fluorescent powder mixed by the red, blue and green colors to produce a white light with three wavelengths. The speciality of the present invention is to use the purple light emitting diode to excite the red fluorescent powder thereby producing a purplish pink light emitting diode. Using the wavelength range of a visible light to excite prevents the sealed gel body from deterioration due to long term irradiation of the ultraviolet light. The most neoteric color thereof provides the application of the light emitting diode more variable options.

The present invention uses the oxide red fluorescent powder to have a preferred excitation spectrum and emission efficiency at the section of the purple light. It has the advantages of having long lifetime and being weatherproof. The new purplish pink or pinkish red color is suitable to be applied on a consumer product, such as a mobile phone or a personal digital assistant for backlight, decoration or illuminating the display. It will be a new product attracting the female consumers and the young generation due to the extensive scope of its application and the unique color (similar to the color of a Hello Kitty).

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A purplish pink light emitting diode comprising:
   a LED chip of a purple light emitting diode with a light emission wavelength ranging from 405 to 430 nm; and
   an excited red fluorescent powder with components of $6(MgO).As_2O_5$: Mn or $3.5(MgO).0.5(MgF_2).GeO_2$: Mn applied to the LED chip; wherein
   the light emitted from the LED chip of the purple light emitting diode with a wavelength ranging from 405 to 430 nm excites the red fluorescent powder coated thereon to produce a red color light with a wavelength about 650 nm; and
   mixing the red and the purple color lights produces the purplish pink light emitting diode.

2. The purplish pink light emitting diode according to claim 1, wherein:
   an amount of the red fluorescent powder applied to the purple light emitting diode controls the color of a resultant light emitting diode.

3. The purplish pink light emitting diode according to claim 1, wherein:
   the purplish pink light emitting diode is sealed into a lamp LED.

4. The purplish pink light emitting diode according to claim 1, wherein:
   the purplish pink light emitting diode is sealed into a surface mount LED.

* * * * *